() United States Patent  
Mori et al.

(10) Patent No.: US 6,391,422 B1  
(45) Date of Patent: May 21, 2002

(54) WIRING SUBSTRATE AND STIFFENER THEREFOR

(75) Inventors: Seiji Mori, Nishi-machi; Takuya Hando, Aichi, both of (JP)

(73) Assignee: NGK Spark Plug Co., Ltd., Nagoya (JP)

(*) Notice: Subject to any disclaimer, the term of this patent is extended or adjusted under 35 U.S.C. 154(b) by 157 days.

(21) Appl. No.: 09/579,140

(22) Filed: May 30, 2000

(51) Int. Cl.$^7$ ............................. B32B 3/02; B32B 9/00; H05F 7/00
(52) U.S. Cl. .................. 428/131; 428/457; 428/458; 428/469; 428/901; 361/807; 361/809
(58) Field of Search ................................. 428/131, 457, 428/458, 469, 901; 174/138 G; 361/807, 809

(56) References Cited

U.S. PATENT DOCUMENTS 5,221,399 A * 6/1993 Sanborn et al. ............. 156/285  
6,145,365 A * 11/2000 Miyahara ..................... 73/332

FOREIGN PATENT DOCUMENTS

JP 9-293808 11/1997  
JP 10-50877 2/1998

* cited by examiner

Primary Examiner—Deborah Jones  
Assistant Examiner—Stephen Stein  
(74) Attorney, Agent, or Firm—Larson & Taylor, PLC

(57) ABSTRACT

A wiring substrate includes a wiring substrate body and a stiffener. The latter is formed from a rolled metallic sheet and is bonded to a first main surface of the wiring substrate body. The stiffener has a boundary profile, in a plan view, which is substantially identical to that of the wiring substrate body, and a first direction of the boundary profile of the stiffener or the wiring substrate body intersects the rolling direction of the stiffener at an angle. This construction reduces the amount of deformation of the wiring substrate produced by bonding of the stiffener to the wiring substrate body and/or caused by temperature variations experienced by the construction. Because of this reduction in deformation, the wiring substrate provides improved reliability with respect to connections made to an electronic component mounted thereon as well as improved reliability with respect to connections made to another printed wiring board.

10 Claims, 8 Drawing Sheets

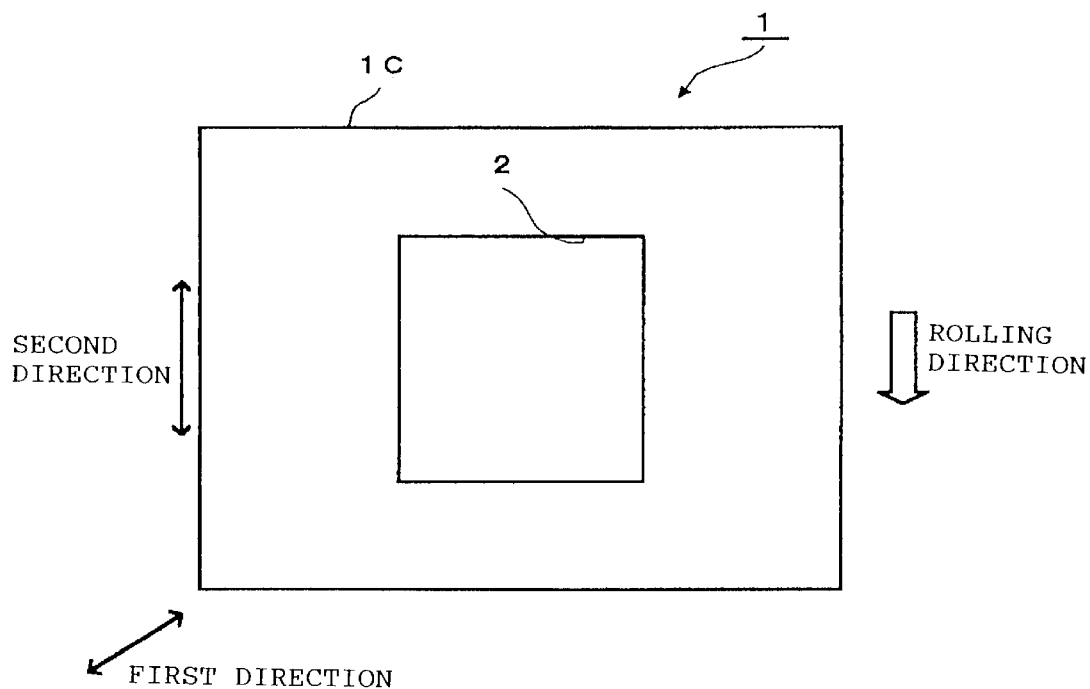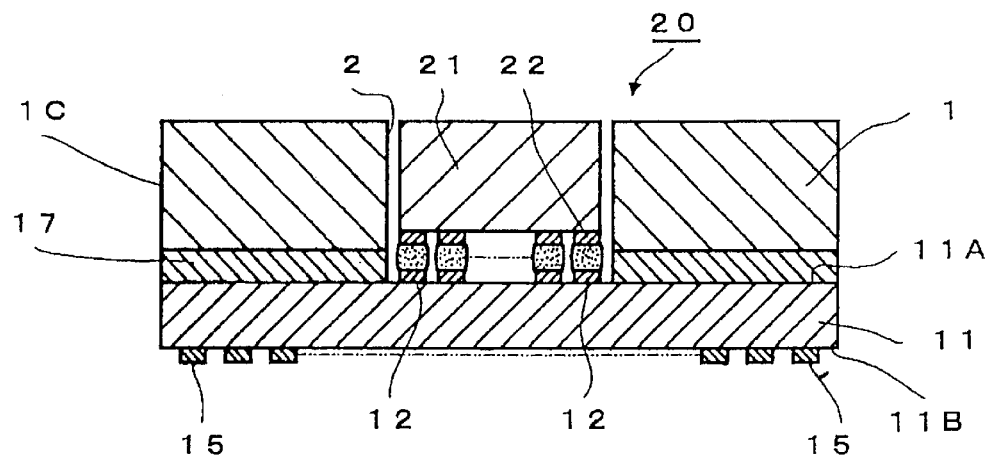

WIRING SUBSTRATE AND STIFFENER THEREFOR

BACKGROUND OF THE INVENTION

1. Field of the Invention

The present invention relates to a wiring substrate which includes a wiring substrate body and a metallic plate serving as a stiffener or the like, as well as to the metallic plate itself. More particularly, the invention relates to a wiring substrate which includes a metallic plate formed from a rolled metallic sheet and serving as a stiffener or the like, as well as to the metallic plate.

2. Description of the Related Art

Conventionally, there is known a wiring substrate which includes a metallic stiffener bonded to a main surface of a wiring substrate body. Such a stiffener is used in instances wherein, due to low rigidity, the wiring substrate body easily deforms upon being subjected to an external force, or wherein the wiring substrate body easily deforms due to thermal expansion or other causes. The stiffener suppresses deformation of the wiring substrate and thus maintains the flatness of the wiring substrate, thereby increasing reliability of the wiring substrate.

An example of such a prior art wiring substrate is shown in FIGS. 9A and 9B, wherein FIG. 9A is an enlarged sectional view of a wiring substrate 220, and FIG. 9B shows a stiffener 201 for use in the wiring substrate 220. As illustrated, the wiring substrate 220 includes the stiffener 201, a wiring substrate body 211, and an IC chip 221. The stiffener 201 is a metallic plate of a predetermined rectangular shape formed from a rolled metallic sheet, and has a through-hole 202 formed at a central portion thereof so as to accommodate the IC chip 221.

The boundary profile or perimeter 211C of the wiring substrate body 211 has a rectangular shape substantially identical with that of the stiffener 201. The wiring substrate body 211 includes connection pads 212, which are formed on a first main surface 211A and which correspond to terminals 222 of the IC chip 221 to be mounted thereon, and electrode pads 215, which are formed on a second main surface 211B such that electrical continuity is established between the connection pads 222 and the corresponding electrode pads 215. The stiffener 201 is bonded to the first main surface 211A of the wiring substrate body 211 using an adhesive layer 217 such that the profile 211C of the wiring substrate body 211 is in substantial alignment with the profile 201 C of the stiffener 201. The IC chip 221 is mounted on the first main surface 211A in such a manner as to be accommodated within the through-hole 202 formed in the stiffener 201. The terminals 222 of the IC chip 221 are soldered to the corresponding connection pads 212.

In some cases, a space defined by the IC chip 221 and the first main surface 211A of the wiring substrate body 211 is filled with underfill resin so as to improve reliability of connection between the IC chip 221 and the connection pads 212. In some cases, a heat radiation plate with or without fins is attached to the stiffener 201 and the IC chip 221 in order to effectively radiate heat generated by the IC chip 221.

However, when the stiffener 201 is bonded to the wiring substrate body 211 in the course of manufacture of the wiring substrate 220, the wiring substrate 220 may suffer deformation, such as warpage or waviness. This conceivably results from a difference in coefficient of thermal expansion between the stiffener 201 and the wiring substrate body 211 or from a small variation in coefficient of thermal expansion within the wiring substrate body 211.

In the case where the IC chip 221 is mounted on the wiring substrate body 211 after the stiffener 201 is bonded to the wiring substrate body 211, such a deformation may cause failure in one or more of the connections between the terminals 222 of the IC chip 221 and the corresponding connection pads 212 of the wiring substrate body 211, thereby resulting in an impairment in the yield of acceptable devices produced by the corresponding manufacturing process. In the case where the stiffener 201 is bonded to the wiring substrate body 211 after the IC chip 221 is mounted on the wiring substrate boy 211, a strong stress force is produced which acts on connections between the terminals 222 of the IC chip 211 and the connection pads 212 of the wiring substrate body 211, potentially resulting in cracking in one or more of these connections and a resultant electrical defect. When the wiring substrate 220 is mounted on another printed wiring board, the connection provided between the printed wiring board and the electrode pads 215 of the wiring substrate 220 may be unacceptable, again resulting in an impairment or reduction in yield.

The warpage or waviness of the wiring substrate 220 varies with temperature. Accordingly, when the process of mounting the IC chip 221 is repeatedly started and stopped, i.e., when the wiring substrate 220 is repeatedly subjected to cooling and heating cycles, stress forces acting on connections between the terminals 222 of the IC chip 221 and the corresponding connection pads 212 of the wiring substrate body 211 can cause progressive metal fatigue over time in the connection(s), resulting in cracking in the connection(s) and a resultant electrical defect.

SUMMARY OF THE INVENTION

One aspect of the present invention concerns the discovery or inventive appreciation by the present inventors that deformation of a wiring substrate such as that shown at 220 does not arise isotropically, but rather tends to arise intensively in a given direction. Specifically considering the prior art device described above, when the stiffener 201 is bonded to the wiring substrate body 211 such that the short sides of the wiring substrate body 211 of rectangular shape are oriented in substantially the same direction as the rolling direction of the stiffener 201, the amount of deformation of the wiring substrate 220 is minimized. In contrast, when the stiffener 201 is bonded to the wiring substrate body 211 such that the diagonal direction of the wiring substrate body 211 is parallel with the rolling direction of the stiffener 201, the amount of deformation of the wiring substrate 220 is maximized. Accordingly, by studying the relationship between the rolling direction of the stiffener 201 and the shape of the wiring substrate body 211 and that of the stiffener 201, the amount of deformation of the wiring substrate 220 can be controlled.

The present invention is based on the findings of the inventors discussed above and an object of the invention is to provide a wiring substrate which is equipped with a metallic plate serving as, for example, a stiffener, and which is constructed so as to reduce or suppress deformation which arises in the course of manufacture, and deformation due to temperature variations during operation. Another object of the present invention is to provide the metallic plate serving as, for example, a stiffener.

To achieve the foregoing objects, the present invention provides a wiring substrate comprising a wiring substrate body having a main surface; and a metallic plate formed from a rolled metallic sheet and having a rolling direction, the metallic plate having a boundary profile or outline, as viewed in plan, which is substantially identical to, or smaller than, that of the wiring substrate body, and the metallic plate being bonded to the wiring substrate body within the main surface. When two parallel lines are in contact with and enclose therebetween the boundary profile or outline of the metallic plate (hereinafter such parallel lines will be described as simply "enclosing" the profile) in such a manner as to maximize the perpendicular distance between these lines, a first direction of the profile of the metallic plate extending perpendicular to the two parallel lines intersects the rolling direction of the metallic plate at an angle. Preferably, the metallic plate serves as a stiffener for reinforcing the wiring substrate body. However, the metallic plate may be a heat sink, a metal lid, or any other functional element.

Being formed from a rolled metallic sheet, the stiffener exhibits anisotropic rigidity, meaning that the stiffener deforms more easily in its rolling direction than in a direction perpendicular to this rolling direction. As mentioned previously, when the stiffener is bonded to the wiring substrate body, stress may be produced because of fine differences in the coefficient of thermal expansion between the stiffener and the wiring substrate body. Accordingly, the wiring substrate significantly warps or becomes wavy in the rolling direction of the stiffener, in which the bonded stiffener deforms relatively easily. In contrast, the wiring substrate warps less or becomes less wavy in a direction perpendicular to the rolling direction, i.e., the direction in which the stiffener deforms less easily. Thus, when the first direction of the boundary profile of the stiffener matches the rolling direction, i.e., when the first direction of the profile of the stiffener extends parallel with the rolling direction, the dimension of the stiffener is the longest in the rolling direction (i.e., in the first direction), the direction in which the stiffener is more likely to deform. Therefore, the wiring substrate warps or becomes wavy along this longest dimension and consequently, the amount of deformation of the wiring substrate is of a maximum. For example, in the case of a rectangular stiffener, when its diagonal direction, (i.e., the direction defined by a line between opposed corners of the rectangle) matches, i.e., extends in the same direction as or parallel to, the rolling direction, the amount of deformation of the wiring substrate is at a maximum. Accordingly, when the first direction of the profile of the stiffener intersects the rolling direction at an angle rather than matching or extending parallel thereto, the amount of deformation of the wiring substrate can be reduced.

Reduction or suppression of the deformation of the wiring substrate improves the reliability of connections made between the wiring substrate and an electronic component mounted thereon, as well as the reliability of connections made between the wiring substrate and another printed wiring board on which the wiring substrate is mounted. Accordingly, in manufacture of the wiring substrate or in the connection of the wiring substrate to another printed wiring board, yield is improved because of the improved reliability of the wiring substrate.

The amount of deformation, such as warpage or waviness, caused by temperature variations to which the wiring substrate is subjected, is also reduced as compared with a case wherein the first direction of the profile of the stiffener extends parallel to the rolling direction of the stiffener. Consequently, even when the wiring substrate undergoes repeated cooling and heating cycles associated with the repeated start-stop operations of an electronic component mounted thereon, there is a reduction of the potential fractures in the connections between the associated electronic component and the wiring substrate body or between the wiring substrate and another printed wiring board, as well as in associated electrical defects.

As used herein, the "first direction" of a boundary profile or region denotes a direction perpendicular to two parallel lines that enclose therebetween the profile or region in such a manner as to maximize the distance between the parallel lines. When a particular profile or region involves a plurality of cases where the distance between the two enclosing lines is maximized, as in the case of a rectangular profile, any one of the cases can be selected in defining the first direction. The "second direction" of a profile or region denotes a direction perpendicular to two further parallel lines that enclose therebetween the profile or region in such a manner as to minimize the distance between the further lines.

A dimension of a profile or region that extends along the rolling direction denotes or refers to a dimension defined by the perpendicular distance between two parallel lines that are perpendicular to the rolling direction and enclose therebetween the profile or region.

The wiring substrate body may have any form so long as the body includes an insulating layer and a wiring layer. Examples of such a wiring substrate body include a laminated wiring substrate body having a plurality of insulating layers and wiring layers arranged in an alternating manner on a single side, or on opposite sides, of a core substrate. The wiring substrate body does not necessarily include a core substrate. The insulating layer may be made of a number of different materials including the following: a resin, such as an epoxy resin, a polyamide resin, a BT resin, or a PPE resin; a composite material, such as a composite of any one of the above-mentioned resins and glass fiber (glass woven fabric or glass unwoven fabric) or a composite of any one of the resins and organic fiber, such as polyamide fiber; a resin-resin composite material formed by impregnating a three-dimensional network fluorine-containing resin base material, such as continuously porous PTFE, with a resin, such as an epoxy resin; or a ceramic, such as alumina.

The wiring substrate body may include terminals, such as connection pads or bumps, formed on the main surface thereof for connection thereto of an IC chip or any other electronic component. For example, when an IC chip is to be mounted on the wiring substrate body, the connection pads or bumps may be arranged in a lattice or an ordered array in many cases, but are not necessarily arranged regularly in a lattice. The wiring substrate body may include terminals, such as connection pads or bumps, formed thereon or upright pins arranged thereon, for connection to another printed wiring board.

The boundary profile or outline of the wiring substrate body may have a substantially rectangular shape or form (including a substantially square form), a polygonal form, or any other form in accordance with the objectives of the invention as described herein.

The material used for the stiffener may be selected as appropriate, taking into consideration such factors as rigidity and the coefficient of thermal expansion. The stiffener may be formed from a rolled sheet of, for example, copper, copper alloy, aluminum, or stainless steel. Such a metallic sheet may be plated with, for example, nickel or gold.

When the coefficient of thermal expansion of the stiffener is greatly different from that of the wiring substrate body, the resultant wiring substrate becomes more likely to deform. Therefore, a small difference in coefficient of thermal expansion is preferred.

The boundary profile or outline of the stiffener may have a substantially rectangular shape or form (including a substantially square shape or form), a polygonal form, or any other form, in accordance with the objectives of the invention. The profile or outline of the stiffener is not necessarily similar to that of the wiring substrate body. In order to mount an IC chip or any other electronic component on the wiring substrate body, the stiffener may have a corresponding through-hole formed therein.

The material for an adhesive layer used for bonding the stiffener and the wiring substrate body may be selected as appropriate in consideration of such factors as the adhesion thereof to the stiffener and the wiring substrate body, the bonding temperature, and the heat resistance of the wiring substrate body. An adhesive in paste form or film form may be used in forming the adhesive layer.

The wiring substrate may include not only the wiring substrate body and the stiffener but also an IC chip or any other electronic component. A plurality of electronic components may be mounted on the wiring substrate.

Preferably, in the above-described wiring substrate, when two parallel lines enclose therebetween the profile or outline of the stiffener in such a manner as to minimize the distance therebetween, the second direction of the profile or outline of the stiffener perpendicular to the two lines substantially matches the rolling direction of the stiffener.

Because the second direction of the profile or outline of the stiffener substantially matches the rolling direction of the stiffener, in the case of, for example, a substantially rectangular stiffener, the direction of the short sides of the rectangular stiffener substantially matches the rolling direction. Accordingly, the dimension of the profile or outline of the stiffener along the rolling direction is the shortest dimension thereof, thereby minimizing the amount of deformation of the wiring substrate associated with bonding of the stiffener to the wiring substrate body and that associated with temperature variations to which the substrate is subjected. Therefore, the wiring substrate can very significantly improve the reliability of a connection or connections made to an electronic component mounted thereon as well as the reliability of a connection or connections made to another printed wiring board.

Preferably, the wiring substrate comprises a wiring substrate body having a main surface and a substantially rectangular shape or form as viewed from above; and a stiffener formed from a rolled metallic sheet, and the profile or outline of the stiffener is substantially identical to that of the wiring substrate body and is thus rectangular as well, the metallic plate being bonded to the main surface of the wiring substrate body and the profile or outline of the stiffener is substantially aligned with that of the wiring substrate body. The diagonal direction of the stiffener intersects the rolling direction of the stiffener at an angle.

Because the diagonal direction of the profile or outline of the stiffener intersects the rolling direction of the stiffener at an angle, the dimension of the stiffener along the rolling direction is shorter than that along the diagonal direction. Accordingly, the stiffener is less likely to deform than a stiffener in which the diagonal direction of the profile or outline matches the rolling direction. Because the amount of deformation of the wiring substrate associated with bonding of the stiffener to the wiring substrate body and that associated with temperature variations can be significantly reduced, the resultant wiring substrate can improve the reliability of a connection or connections made to an electronic component mounted thereon as well as the reliability of a connection or connections made to another printed wiring board.

Preferably, the direction of short sides of the rectangular stiffener substantially matches the rolling direction of the stiffener. Because the direction of short sides of the profile or outline of the stiffener substantially matches the rolling direction of the stiffener, the dimension of the stiffener along the rolling direction is the shortest dimension. Thus, the amount of deformation of the wiring substrate associated with bonding of the stiffener to the wiring substrate body and that associated with temperature variations can be reduced or suppressed. Therefore, the wiring substrate can improve the reliability of a connection or connections made to an electronic component mounted thereon as well as the reliability of a connection or connections made to another printed wiring board.

The present invention further provides a metallic plate for the above-described wiring substrate. The metallic plate is cut from a rolled metallic sheet such that the first direction of the profile or outline of the metallic plate intersects the rolling direction of the metallic plate at an angle.

In the stiffener of the present invention, the dimension along its rolling direction is shorter than that along its first direction. Thus, the stiffener is less likely to warp or become wavy than one in which the first direction of the profile or outline substantially matches its rolling direction. Through use of the stiffener of the present invention, manufacture of a wiring substrate enables reduction or suppression of deformation of a wiring substrate body associated with bonding of the stiffener to the wiring substrate body, meaning that the deformation of the resultant wiring substrate is also reduced or suppressed. In addition, the amount of deformation of the wiring substrate associated with, i.e., resulting from, temperature variations experienced by the substrate is also reduced or suppressed. Therefore, the wiring substrate of the invention can improve the reliability of a connection or connections made to an electronic component mounted thereon as well as the reliability of a connection or connections made to another printed wiring board.

Preferably, the second direction of the profile or outline of the stiffener substantially matches the rolling direction of the stiffener. In a stiffener of this construction, because the second direction of the profile or outline substantially matches its rolling direction, the dimension along the rolling direction is the shortest dimension. According, through use of this stiffener, manufacture of a corresponding wiring substrate results in minimization of deformation of the wiring substrate associated with bonding of the stiffener to a wiring substrate body as well as minimization of deformation of the wiring substrate associated with temperature variations to which the substrate is subjected. Therefore, the wiring substrate can dramatically improve the reliability of a connection or connections made to an electronic component mounted thereon as well as the reliability of a connection or connections made to another printed wiring board.

The present invention still further provides a wiring substrate comprising a wiring substrate body having a main surface; and a metallic plate formed from a rolled metallic sheet, the profile or outline of the metallic plate being substantially identical with or larger than that of the wiring substrate body, and the main surface of the wiring substrate body being bonded to the metallic plate within the profile or outline of the metallic plate. When two parallel lines enclose therebetween the profile or outline of the wiring substrate in such a manner as to maximize the perpendicular distance between the lines, a first direction of the outline of the wiring substrate body perpendicular to the two lines intersects the rolling direction of the metallic plate at an angle. Preferably, the metallic plate serves as a stiffener for reinforcing the wiring substrate body. However, the metallic plate may be a heat sink, a metal lid, or any other functional element.

As mentioned previously, the stiffener is more likely to deform in its rolling direction. It is also noted that the portion of the wiring substrate where the stiffener and the wiring substrate body are bonded together suffers stress and deformation. Accordingly, when the profile or outline of the metallic plate is substantially identical to, or larger than, that of the wiring substrate body, the deformation of the wiring substrate varies greatly according to the relationship between the profile or outline of the wiring substrate body and the rolling direction of the stiffener.

When the first direction of the profile or outline of the wiring substrate body intersects the rolling direction of the stiffener at an angle, deformation of the wiring substrate occurring during the course of manufacture and deformation due to temperature variations to which the substrate is subjected can be reduced or suppressed. Thus, the wiring substrate of the present invention can improve the reliability of a connection or connections made to an electronic component mounted thereon as well as the reliability of a connection or connections made to another printed wiring board. Accordingly, the overall fabrication yield can be improved, and a wiring substrate of high reliability can be obtained.

Preferably, in the wiring substrate described above, when two parallel lines enclose therebetween the profile or outline of the wiring substrate body in such a manner as to minimize the distance therebetween, the second direction of the profile or outline of the wiring substrate body perpendicular to the two lines substantially matches the rolling direction of the stiffener. Since the second direction of the wiring substrate body substantially matches the rolling direction of the stiffener, the dimension of the wiring substrate body along the rolling direction is the shortest dimension, thereby minimizing the amount of deformation of the wiring substrate associated with bonding of the stiffener to the wiring substrate body and associated with temperature variations. Therefore, the wiring substrate can dramatically improve the reliability of a connection or connections made to an electronic component mounted thereon as well as the reliability of a connection or connections made to another printed wiring board.

The present invention still further provides a wiring substrate comprising a wiring substrate body having a main surface, which includes an IC-chip-mounting region and a metallic-plate-bonding region arranged to substantially surround the IC-chip-mounting region; and a metallic plate formed from a rolled metallic sheet and having a hole corresponding to the IC-chip-mounting region formed therein, the metallic plate being bonded to the metallic-plate-bonding region. When two parallel lines enclose therebetween the IC-chip-mounting region in such a manner as to maximize the distance between the lines, the first direction of the IC-chip-mounting region perpendicular to the two lines intersects the rolling direction of the metallic plate at an angle. Preferably, the metallic plate serves as a stiffener for reinforcing the wiring substrate body. However, the metallic plate may be a heat sink, a metal lid, or any other functional element.

Deformation, such as warpage or waviness, of the wiring substrate may result in a failure to reliably mount an IC chip on the wiring substrate. Further, when the wiring substrate is subjected to cooling or heating after the IC chip is mounted thereon, the amount of warpage or waviness of the wiring substrate varies, thereby causing stress in the connection terminal(s) and potentially resulting in fracture of the connection terminal(s). In this regard, it is noted that the connection terminals that are most distant from the remaining terminals are most susceptible to stress and thus fracture. Through the reduction or suppression of warpage or waviness of the wiring substrate in areas between such connection terminals and other terminals and the reduction or suppression of variations of the warpage or waviness associated with cooling or heating, the connection terminals become less susceptible to fracture, thereby improving connection reliability.

According to the present invention, the first direction of the IC-chip-mounting region intersects the rolling direction of the metallic plate at an angle. Thus, the wiring substrate can reduce or suppress the amount of deformation of the IC-chip-mounting region as compared with a substrate in which the first direction of the IC-chip-mounting region substantially matches the rolling direction of the stiffener. Further, the wiring substrate can reduce or suppress the amount of deformation of the region associated with temperature variations.

Accordingly, when an IC chip is mounted on the wiring substrate body after the stiffener is bonded to the wiring substrate body, the terminals of the IC chip can be reliably connected to the corresponding connection pads or bumps on the wiring substrate body. When the stiffener is bonded to the wiring substrate body after the IC chip is mounted on the wiring substrate body, little stress occurs in the connections, so that the connections are not susceptible to fracture. Since the amount of deformation of the wiring substrate is small when the wiring substrate is subjected to cooling and heating cycles, i.e., to cyclic temperature variations, the connections are less susceptible to fracture, thereby improving the connection reliability.

Preferably, in the above-described wiring substrate, when two parallel lines enclose therebetween the IC-chip-mounting region in such a manner as to minimize the distance between the lines, the second direction of the IC-chip-mounting region perpendicular to the two lines substantially matches the rolling direction of the stiffener. Because the second direction of the IC-chip-mounting region substantially matches the rolling direction of the stiffener, the dimension of the IC-chip-mounting region along the rolling direction is the shortest dimension, thereby minimizing the amount of deformation of the IC-chip-mounting region associated with bonding of the stiffener to the wiring substrate body and that associated with temperature variations. Therefore, the wiring substrate can dramatically improve the reliability of connection thereof to the IC chip mounted thereon.

BRIEF DESCRIPTION OF THE DRAWINGS

FIG. 2 is a plan view of a stiffener according to the first embodiment;

FIG. 3 is an enlarged sectional view of the wiring substrate of FIG. 1A on which an IC chip is mounted;

DESCRIPTION OF THE PREFERRED EMBODIMENTS

First Embodiment

Figure 1A:
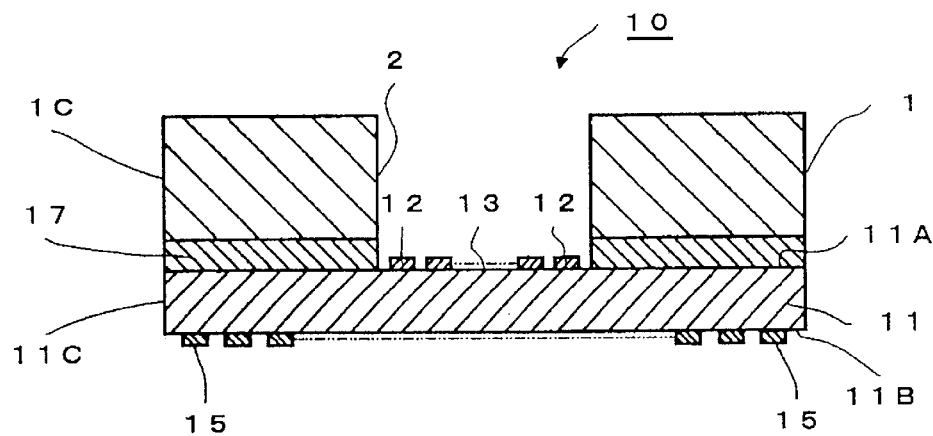
FIG. 1A is an enlarged sectional view of a wiring substrate according to a first embodiment of the present invention.
Figure 1B:
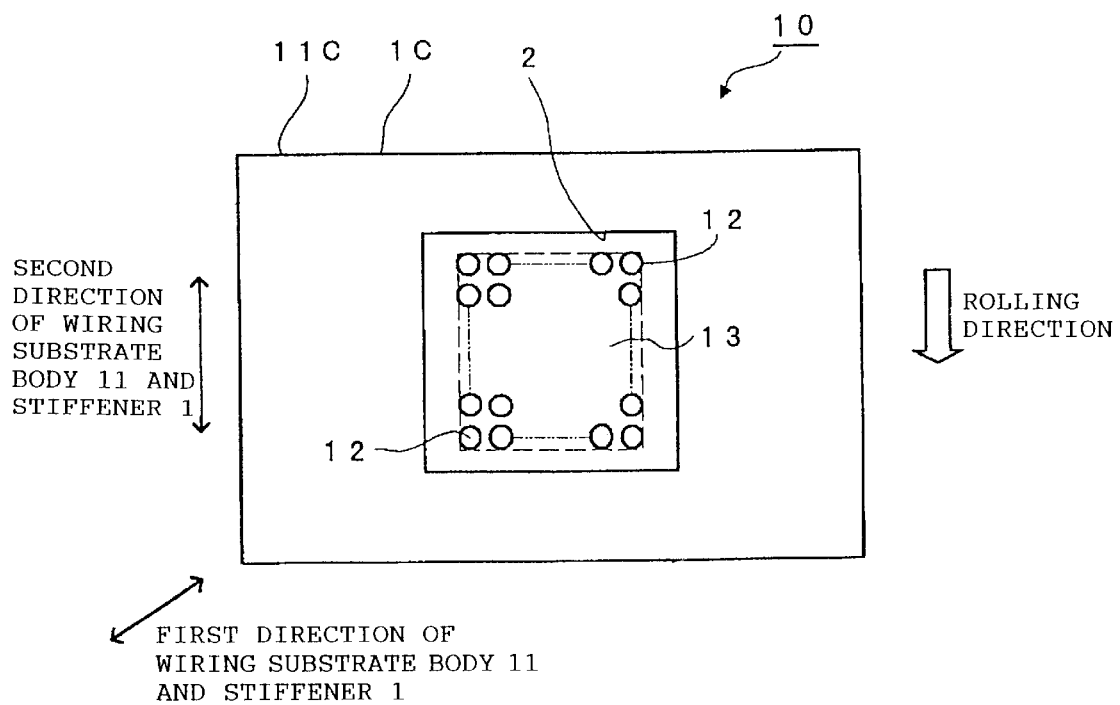
FIG. 1B is a plan view of the wiring substrate of FIG. 1A as viewed from above a first main surface of the wiring substrate body.

A first embodiment of the present invention will next be described with reference to the drawings. As indicated above, FIG. 1A is an enlarged sectional view of a wiring substrate 10, while FIG. 1B is a plan view of the wiring substrate 10 as viewed from above a first main surface 11A of a wiring substrate body 11 and FIG. 2 is a plan view of a stiffener 1.

As illustrated, the wiring substrate 10 has the shape or form of a substantially rectangular plate and includes the stiffener 1 and the wiring substrate body 11. The stiffener 1 and the wiring substrate body 11 are bonded via an adhesive layer 17 such that the respective boundary profiles or outlines 1C and 11C (i.e., the boundary profiles as viewed in a plan view) are substantially aligned with each other.

As shown in FIG. 2, the profile or outline 1C of the stiffener 1 has a substantially rectangular shape or form. In a specific implementation, the stiffener 1 measures 0.7 mm (thickness)×40 mm (length of long side)×30 mm (length of short side). The stiffener 1 has a substantially square through-hole 2 of dimensions of e.g. 18 mm×18 mm, formed therein substantially at the center thereof so as to accommodate an IC chip to be mounted on the wiring substrate body 11. The stiffener 1 is formed, by blanking, from a rolled copper sheet.

The wiring substrate body 11 has the shape or form of a substantially rectangular plate and has a first main surface 11A and a second main surface 11B. The boundary profile or outline 11C of the wiring substrate body 11 has a substantially rectangular shape or form of 40 mm×30 mm, as does the profile or outline 1C of the stiffener 1. As shown in FIG. 1B, a number of connection pads 12 (having a diameter, $\phi$, of, e.g., 115 $\mu$m) are arranged on the first main surface 11A in a lattice arrangement or array substantially corresponding to an IC chip to be mounted thereon. The thus-arranged connection pads 12 define a substantially square IC-chip-mounting region 13 (represented by a dashed line in FIG. 1B), which is slightly smaller than the through-hole 2 formed in the stiffener 1. The connection pads 12 arranged on the first main surface 11A are accommodated within the through-hole 2 formed in the stiffener 1 when the wiring substrate 10 is viewed from above the first main surface 11A.

A number of electrode pads 15 (having a diameter, $\phi$, of, e.g., 520 $\mu$m) are arranged on the second main surface 11B of the wiring substrate body 11 for use in connecting the wiring substrate 10 to another printed wiring board, or to a junction wiring substrate, which is adapted to establish connection between the wiring substrate 10 and another printed wiring substrate. The wiring substrate body 11 includes a plurality of alternating insulating resin layers and wiring layers. Electrical continuity is established between the connection pads 12 and the corresponding electrode pads 15 via the wiring layers (not shown). The insulating resin layers are formed from a composite material prepared through impregnation of a base material of continuously porous PTFE with epoxy resin.

Next, the relationship between the boundary profiles or outlines 1C and 11C and the rolling direction of the stiffener 1 will be described.

As shown in FIG. 2, the rolling direction of the stiffener 1 (which, in the exemplary embodiment under consideration, is the vertical direction and is represented by a first labeled arrow in FIG. 2) intersects a first direction of the profile 1C of the stiffener 1 (which, in this exemplary embodiment, is a diagonal direction represented by a further labeled arrow in FIG. 2) at a particular or certain angle. Further, the rolling direction substantially matches the second direction of the profile 1C (which is the direction of short sides or the vertical direction represented by a further labeled arrow in FIG. 2). In other words, the rolling direction extends parallel to the short side of the perimeter 11C of the substrate 11.

As mentioned previously, in the wiring substrate 10, the stiffener 1 and the wiring substrate body 11 are bonded such that the respective boundary profiles or outlines 1C and 11C are substantially aligned with each other. Accordingly, as shown in FIG. 1B, the rolling direction of the stiffener 1 (i.e., the vertical direction represented by an arrow in FIG. 1B) also intersects the first direction of the profile or outline 11C of the wiring substrate body 11 (i.e., the diagonal direction represented by an arrow in FIG. 1B) at a particular angle. Further, the rolling direction substantially matches the second direction of the profile or outline 11C of the wiring substrate body 11 (the direction of the short sides or the vertical direction represented by a further arrow in FIG. 1B).

The relationship between the rolling direction of a stiffener and warpage of a wiring substrate associated with bonding of the stiffener to a wiring substrate body has been examined, as describe below.

Considering the examination of warpage mentioned above, the stiffener 1 was bonded to the wiring substrate body 11 and the resultant wiring substrate 10 was measured for warpage. As a comparative embodiment, a wiring substrate was manufactured by use of a stiffener having the same profile or outline as that of the stiffener 1 and in which the first direction (i.e., the diagonal direction) of the profile or outline substantially matches its rolling direction, and this wiring substrate was also measured for warpage. Five samples of the present embodiment and five samples of the comparative embodiment were prepared.

The measurement results are shown in Table 1.

TABLE 1

|  | Warpage (μm) | Mean warpage (μm) |
|---|---|---|
| First embodiment | 12 | 18 |
|  | 13 |  |
|  | 18 |  |
|  | 21 |  |
|  | 28 |  |
| Comparative embodiment | 30 | 42 |
|  | 38 |  |
|  | 40 |  |
|  | 48 |  |
|  | 52 |  |

As seen from Table 1, the wiring substrates 10 of the above-described embodiment of the present invention exhibit a smaller amount of warpage (i.e., a smaller amount of deformation) than do the wiring substrates of the comparative embodiment. This is conceivably because a stiffener formed from a rolled steel sheet is likely to deform in its rolling direction, and is unlikely to deform in a direction perpendicular to the rolling direction.

In the stiffener 1 of the embodiment under consideration, the dimension along the rolling direction is the shortest dimension, whereas, in the stiffener of the comparative embodiment, the dimension along the rolling direction is the longest dimension. Accordingly, the stiffener 1 of the present embodiment is less likely to deform than is the stiffener of the comparative embodiment. As a result, the wiring substrate 10 of the present embodiment exhibits a smaller amount of deformation than does the wiring substrate of the comparative embodiment. That is, as the dimension of a stiffener along the rolling direction of the stiffener decreases, the stiffener becomes less likely to deform, and thus the wiring substrate becomes less likely to deform. As in the case of the present embodiment in which the profile or outline 1C of the stiffener 1 is substantially identical to the profile or outline 11C of the wiring substrate body 11, it can be concluded that as the dimension of a wiring substrate body along the rolling direction of a stiffener decreases, a wiring substrate becomes less likely to deform.

As described above, in the wiring substrate 10 according to the present embodiment, the first direction of the profile or outline 1C (11C) of the stiffener 1 (wiring substrate body 11) intersects the rolling direction of the stiffener 1 at a particular angle, and the second direction of the profile or outline 1C (11C) substantially matches the rolling direction. Thus, when the stiffener 1 is bonded to the wiring substrate body 11, any associated warpage or waviness of the resultant wiring substrate 10 can be eliminated or substantially suppressed.

Accordingly, as shown in FIG. 3, when an IC chip 21 is mounted on the wiring substrate 10 so as to fabricate a wiring substrate 20, terminals 22 of the IC chip 21 and the corresponding connection pads 12 of the wiring substrate body 11 can be reliably connected.

Also, when the wiring substrate 10 (20) is mounted on another printed wiring board, the electrode pads 15 of the wiring board 10 (20) can be reliably connected to the printed wiring board.

Even when the wiring substrate 10 (20) is subjected to repeated cycles of heating and cooling, or other temperature variations, the amount of variation due to warpage or waviness thereof is small. Thus, no fracture occurs in connections between the wiring substrate body 11 and the IC chip 21 or between the wiring substrate 10 (20) and another printed wiring board, so that a connection of high reliability is provided.

The present embodiment has been described hereinabove with respect to the wiring substrates 10 and 20 in which the second directions of the outlines 1C and 11C of the stiffener 1 and the wiring substrate body 11, respectively, substantially match the rolling direction of the stiffener 1. However, it should be understood that the present invention is not limited to this specific embodiment. In this regard, highly reliable connections can be attained so long as the first direction of the profile or outline 1C (11C) intersects the rolling direction at an angle. However, the second direction preferably matches the rolling direction as in the present embodiment described above, since connection reliability is most dramatically improved with respect to such an embodiment.

Next, the method of manufacturing the wiring substrate 10 (FIGS. 1A and 1B) and the stiffener 1 for use in the wiring substrate 10 will be described with reference to FIG. 4.

Figure 4:
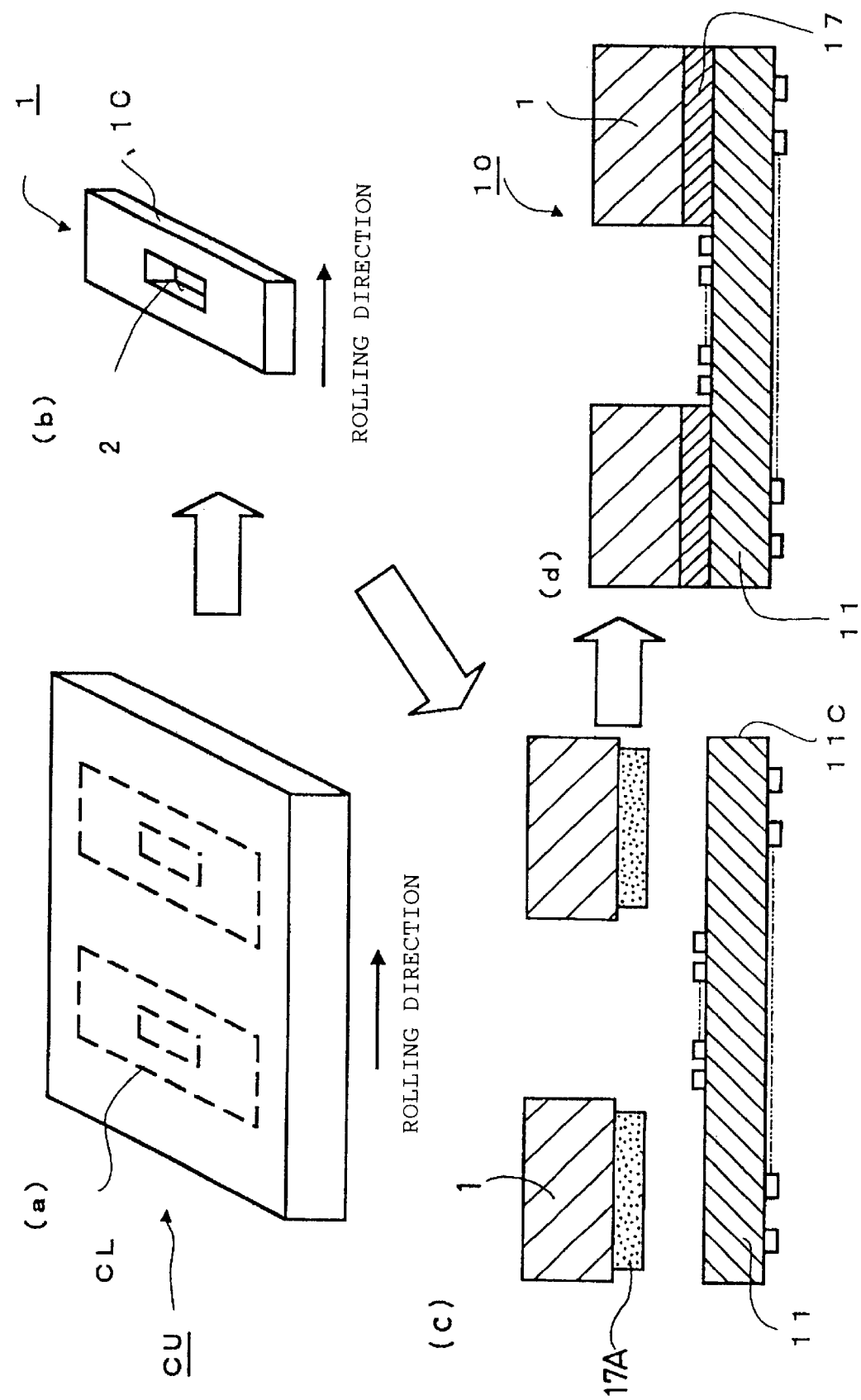
FIG. 4 is an explanatory view showing a method of manufacturing the stiffener of the first embodiment, wherein (a) is a perspective view of a rolled copper sheet, (b) is a perspective view of a stiffener blanked from the copper sheet, (c) is a sectional view showing an operation in which a bonding sheet is attached to the stiffener in advance, and (d) is a sectional view of a completed wiring substrate.

The stiffener 1 is manufactured as illustrated in FIG. 4 in figures (a), (b), (c) and (d). Specifically, a rolled copper sheet CU having a thickness of 0.7 mm shown in FIG. (a) of FIG. 4 is prepared. The copper sheet CU is subjected to blanking along dashed line CL. The thus-obtained blank is plated with nickel or gold (not shown), thereby forming the stiffener 1 (see figure (b) of FIG. 4) having the through-hole 2 formed therein. It is important to note that blanking is performed such that the second direction of the profile or outline 1C of the stiffener 1 substantially matches the rolling direction represented by an arrow in figure (a) of FIG. 4 (i. e., such that the first direction of the profile or outline 1C intersects the rolling direction at an angle).

Next, as shown in figure (c) of FIG. 4, an adhesive sheet 17A (having a thickness of. e.g., 100 μm) is preliminarily attached to the manufactured stiffener 1 at a temperature of 100–1200° C. The adhesive sheet 17A is formed through impregnation of a base material of continuously porous PTFE with epoxy resin as in the case of an insulating resin layer, but wherein the epoxy resin content is lower. Subsequently, the stiffener 1 is placed on the wiring substrate body 11 such that the adhesive sheet 17A is held therebetween, followed by compression through application of heat at a temperature of 170° C. As a result the wiring substrate 10 is completed as shown in figure (d) of FIG. 4 (and FIGS. 1A and 1B).

The adhesive sheet 17A and the stiffener 1 may sequentially be placed in layers on the wiring substrate body 11. Preferably, the adhesive sheet 17A is attached beforehand to the stiffener 1 so as to facilitate alignment among the three elements. Alternatively, the adhesive sheet 17A may be preliminarily attached to the wiring substrate body 11 in advance. In order to prevent oozing of adhesive, the adhesive sheet 17A advantageously has a size slightly smaller than that of the profile or outline 1C of the stiffener 1. According to this embodiment, the adhesive sheet 17A is formed from material similar to that used for the insulating layers of the wiring substrate body 11, so as to provide substantial matching of the coefficients of thermal expansion of the adhesive sheet 17A and the wiring substrate body 11.

In a further step, the IC chip 21 is mounted on the wiring substrate 10 so as to yield the wiring substrate 20 shown in FIG. 3. Specifically, solder bumps are formed on the corresponding connection pads 12 of the wiring substrate body 11 and the IC chip 21 is placed on the solder bumps. Subsequently, the solder bumps are melted through application of heat, thereby connecting the terminals 22 of the IC chip 21 to the corresponding connection pad 12 of the wiring substrate body 11. This results in the completed wiring substrate 20.

According to the above-described manufacturing method, after the stiffener 1 is bonded to the wiring substrate body 11, the IC chip 21 is mounted on the wiring substrate body 11. However, the stiffener 1 may be bonded to the wiring substrate body 11 after the IC chip 21 is mounted on the wiring substrate body 11. Even when the wiring substrate 20 shown in FIG. 3 is manufactured by this alternative method, there is elimination or substantial suppression of warpage of waviness of the wiring substrate 20 associated with bonding of the stiffener 1 to the wiring substrate body 11 on which the IC chip 21 is mounted. Thus, no strong stress forces occur in the connections between the IC chip 21 and the wiring substrate body 11, and thus there is no resultant cracking and associated fracture of the connections such as would otherwise result from such strong stress forces.

Second Embodiment

A second embodiment of the present invention will next be described. The present embodiment is different from the first embodiment in that a stiffener, a wiring substrate body, and a wiring substrate have a substantially square profile or outline. The description of features similar to those of the first embodiment will, in some instances, be omitted or be significantly abbreviated.

Figure 5A:
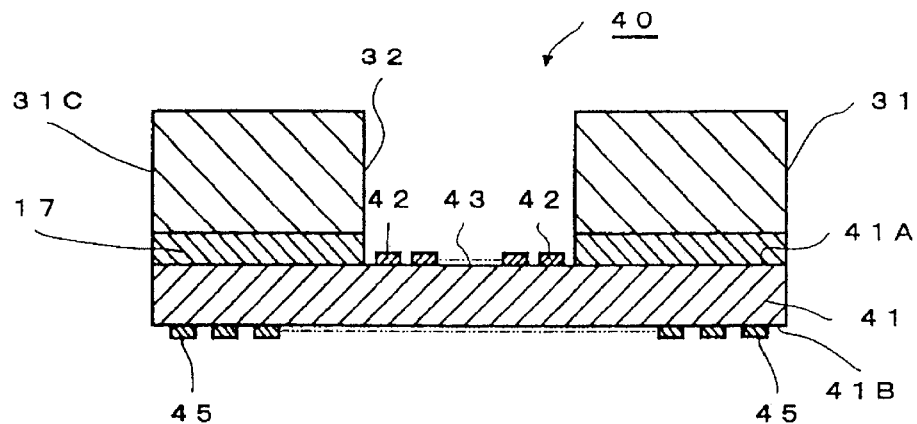
FIG. 5A is an enlarged sectional view of a wiring substrate according to a second embodiment of the present invention.
Figure 5B:
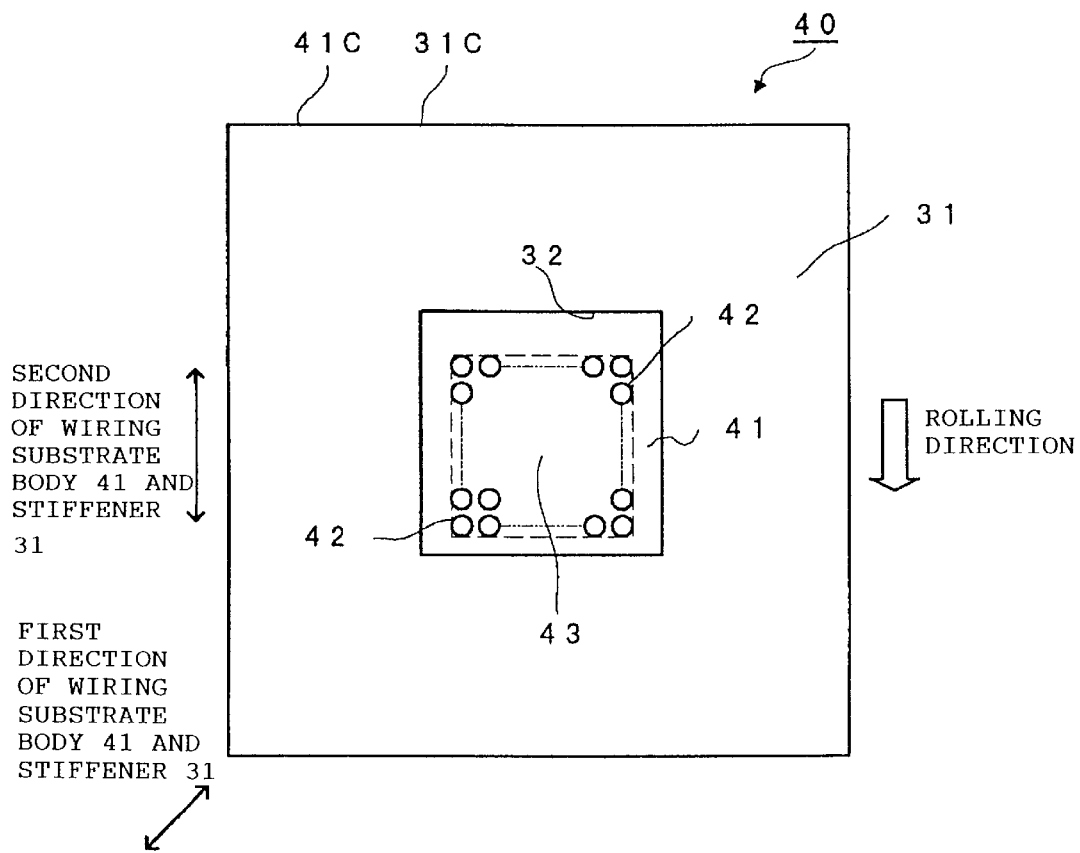
FIG. 5B is a plan view of the wiring substrate of FIG. 5A as viewed from above a first main surface of the wiring substrate body.

As indicated above, FIG. 5A is an enlarged sectional view of a wiring substrate, denoted 40, while FIG. 5B is a plan view of the wiring substrate 40 as viewed from above a first main surface 41A of a wiring substrate body 41.

The wiring substrate 40 has the shape or form of a substantially square plate measuring 40 mm×40 mm and includes a stiffener 31 and the wiring substrate body 41. As in the first embodiment, the stiffener 31 and the wiring substrate body 41 are bonded via an adhesive layer 17 such that the respective profiles or outlines 31C and 41C are substantially aligned with each other.

The stiffener 31 is formed from a rolled copper sheet and has the substantially square profile or outline 31C illustrated in FIG. 5B. As in the case of the first embodiment, the stiffener 31 has a substantially square through-hole 32 formed therein substantially at the center thereof.

The wiring substrate body 41 has a first main surface 41A and a second main surface 41B. The profile or outline 41C of the wiring substrate body 41 has a substantially square shape or form, which is substantially identical with that of the profile or outline 31C of the stiffener 31. As in the case of the first embodiment, a number of connection pads 42 are arranged on the first main surface 41A and define a substantially square IC-chip-mounting region 43 (represented in dashed lines in FIG. 5B). A number of electrode pads 45 are arranged on the second main surface 41B.

Having described the basic elements of this second embodiment, the relationship between the profiles or outlines 31C and 41C and the rolling direction of the stiffener 31 will now be described.

As shown in FIG. 5B, the rolling direction of the stiffener 31 (which, in the specific implementation illustrated is the vertical direction represented by a first arrow in FIG. 5B) intersects the first direction of the outline 31C of the stiffener 31 (which is a diagonal direction represented by a further arrow in FIG. 5B) at an angle. Further, the rolling direction substantially matches the second direction of the profile or outline 31C (the direction of either one of the short sides, or which in this case is the vertical direction, represented by a further arrow in FIG. 5B).

In addition, the rolling direction of the stiffener 31 intersects the first direction of the profile or outline 41C of the wiring substrate body 41 (which is a diagonal direction represented by the further arrow in FIG. 5B) at an angle. The rolling direction substantially matches the second direction of the profile or outline 41C of the wiring substrate body 41 (the direction of either one of the short sides or the vertical direction, represented by an arrow in FIG. 5B).

As in the case of the first embodiment, the relationship between the rolling direction of the stiffener 31 and warpage of the wiring substrate 40 associated with bonding of the stiffener 31 to the wiring substrate body 41 has been examined, as described below.

In this examination, the stiffener 31 was bonded to the wiring substrate body 41 and the resultant wiring substrate 40 was measured for warpage (deformation). To provide a comparative embodiment, a further wiring substrate was manufactured by use of a stiffener having the same profile or outline as that of the stiffener 31 and in which the first direction of the profile or outline (i.e., diagonal direction) substantially matches the rolling direction, and was measured for warpage (deformation). Five samples of the present, second embodiment and five samples of the comparative embodiment were prepared.

The measurement results are shown in Table 2.

TABLE 2

|  | Warpage ($\mu$m) | Mean warpage ($\mu$m) |
| --- | --- | --- |
| Second embodiment | 20 | 26 |
|  | 22 |  |
|  | 25 |  |
|  | 29 |  |
|  | 34 |  |
| Comparative embodiment | 40 | 46 |
|  | 42 |  |
|  | 45 |  |
|  | 46 |  |
|  | 57 |  |

As can be seen from Table 2, the wiring substrates 40 of the present, second embodiment exhibit a smaller amount of warpage (smaller amount of deformation) than do the wiring substrates of the comparative embodiment.

Because the outline 31C of the stiffener 31 is substantially square, the direction of any one of the sides can be the second direction. In the stiffener 31 of the present, second embodiment, because the second direction of the profile or outline 31C substantially matches the rolling direction, the dimension measured along the rolling direction is the shortest dimension. In contrast, in the stiffener of the comparative embodiment, the dimension measured along the rolling direction is the longest. Accordingly, as in the case of the first embodiment, the stiffener 31 is less likely to deform, and thus the amount of deformation of the wiring substrate 40 is small. In other words, as the dimension of a stiffener along the rolling direction of the stiffener decreases, the stiffener becomes less likely to deform, and thus the wiring substrate becomes less likely to deform.

As in the case of the first embodiment, in the wiring substrate 40 according to the present, second embodiment, the first direction of the profile or outline 31C (41C) of the stiffener 31 (wiring substrate body 41) intersects the rolling direction of the stiffener 31 at an angle, and the second direction of the outline 31C (41C) substantially matches the rolling direction. Thus, when the stiffener 31 is bonded to the wiring substrate body 41 in the manufacture of the wiring substrate 40, the wiring substrate 40 is unlikely to suffer warpage or waviness. Further, the amount of variation in deformation of the wiring substrate 40 when subjected to repeated cycles of heating and cooling is also small. Therefore, the wiring substrate 40 when constructed as described above improves the reliability of connections made to an electronic component mounted thereon as well as the reliability of connections made to another printed wiring board.

It will be appreciated that the wiring substrate 40 of the present, second embodiment may be manufactured in a manner similar to that of the first embodiment.

It is also noted that, in the present, second embodiment, the second directions of the profiles or outlines 31C and 41C of the stiffener 31 and the wiring substrate body 41, respectively, substantially match the rolling direction of the stiffener 31. However, the present invention is not limited to this specific implementation. The above-described improvements can also be obtained when the first direction of the profile or outline 31C (41C) intersects the rolling direction at an angle rather than being the same direction. However, it is noted that the second direction preferably matches the rolling direction as in the case of the present, second embodiment, since the connection reliability is improved most dramatically with this approach.

Third Embodiment

A third embodiment of the present invention will next be described. The third embodiment is different from the second embodiment in arrangement of connection pads for connection to an IC chip to be mounted thereon, i.e., in the form of an IC-chip-mounting region. As before, the description of features similar to those of the first and second embodiments may be omitted or presented in an abbreviated form.

Figure 6:
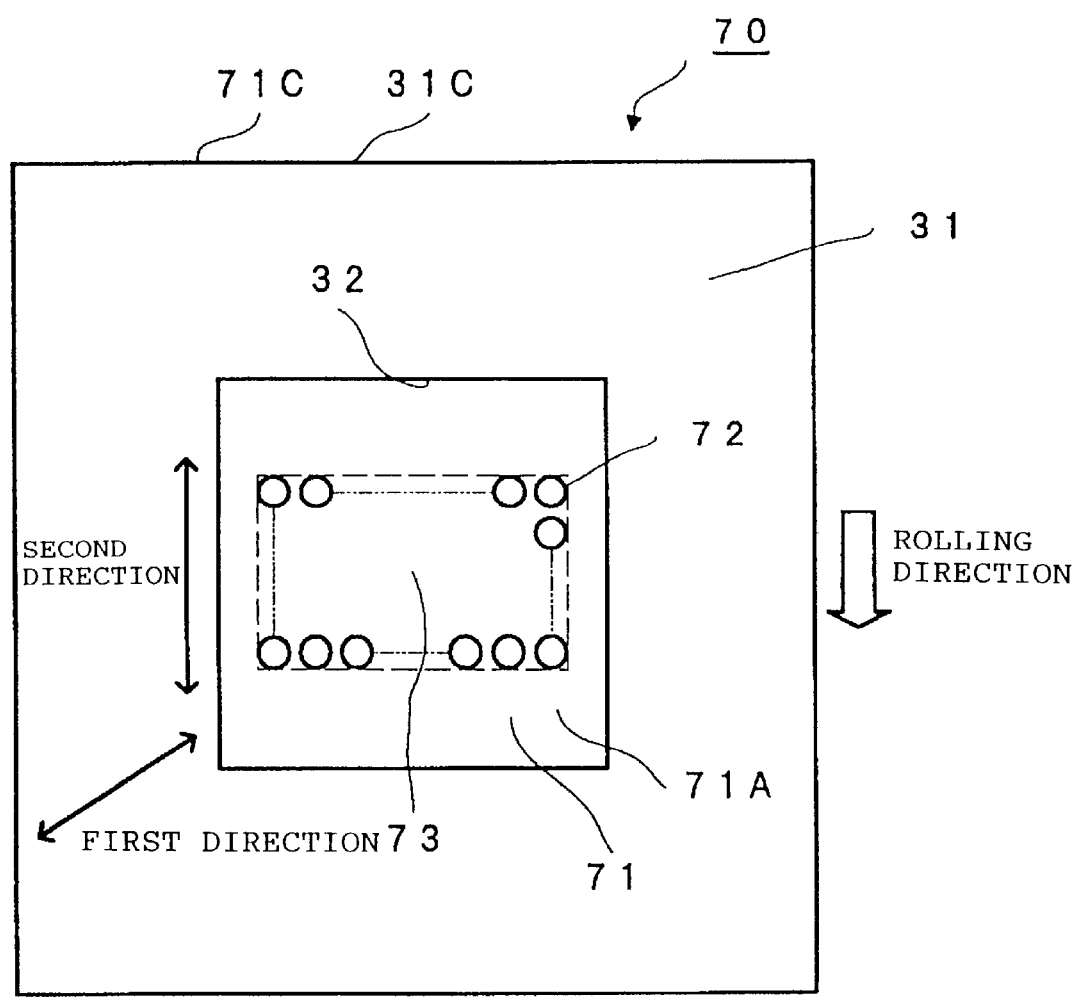
FIG. 6 is a plan view of a wiring substrate according to a third embodiment of the present invention as viewed from above a first main surface of the wiring substrate body.

As indicated above, FIG. 6 is a plan view of the wiring substrate 70 as viewed from above, i.e., a top plan view, of a first main surface 71A of a wiring substrate body 71.

As in the case of the second embodiment, the wiring substrate 70 has the shape or form of a substantially square plate measuring 40 mm×40 mm and includes the wiring substrate body 71 and a stiffener 31 similar to that of the second embodiment. The wiring substrate body 71 and the stiffener 31 are bonded such that the respective profiles or outlines 31C and 71C thereof are substantially aligned with each other.

The wiring substrate body 71 has a first main surface 71A and a second main surface (not shown). A number of connection pads 72 are arranged on the first main surface 71A and define an IC-chip-mounting region 73 represented by dashed lines in FIG. 6. Region 73 is 6.98 mm×4.22 mm in a specific implementation. An IC chip (not shown), having dimensions of, e.g., 15 mm×10 mm, is mounted on region 73.

The relationship between the IC-chip-mounting region 73 and the rolling direction of the stiffener 31 will now be described.

As shown in FIG. 6, the rolling direction of the stiffener 31 (which in the illustrated implementation is the vertical direction, as represented by a first arrow in FIG. 6) intersects the first direction of the IC-chip-mounting region 73 (which is a diagonal direction represented by a further arrow in FIG. 6) at an angle. Further, the rolling direction substantially matches the second direction of the IC-chip-mounting region 73 (which is the direction of short sides or the vertical direction represented by a further arrow in FIG 73.

In order to examine the reliability of the connections between the wiring substrate 70 and an IC chip, an examination was carried out with respect to the relationship between the rolling direction of a stiffener and each of the first and second directions of a substantially rectangular IC-chip-mounting region.

Considering this examination, the wiring substrate 70 was first measured for overall warpage. Subsequently, an IC chip was mounted on the wiring substrate 70, which was then subjected to a heat cycle test (in the range of −55° C. to 125° C., for 1000 cycles) so as to inspect the condition of the electrical connections and the appearance thereof. To provide a comparative embodiment, a wiring substrate was manufactured in the following manner: a stiffener was manufactured such that the rolling direction substantially matched the first direction (i.e., the diagonal direction) of the IC-chip-mounting region 73, and was then bonded to the wiring substrate body 71. The thus-manufactured wiring substrate of the comparative embodiment was similarly examined. Ten (10) samples of the present, third embodiment and ten (10) samples of the comparative embodiment were prepared.

The measurement results are shown in Table 3.

TABLE 3

| | Mean warpage ($\mu$m) | Number of samples of defective connection |
|---|---|---|
| Third embodiment | 30 | 0 |
| Comparative embodiment | 40 | 7 |

As can be seen from Table 3, the wiring substrates 70 of the present, third embodiment exhibit a smaller amount of warpage than do the wiring substrates of the comparative embodiment. This is because the dimension of the stiffener along the second direction as defined above is shorter than that along the first direction.

As a result of the heat cycle test, 7 of 10 samples of the comparative embodiment were found defective in electrical connections, whereas the samples of the present, third embodiment were found free of defective electrical connections.

The foregoing results are conceivably a product of the fact that a portion of the wiring substrate corresponding to the IC-chip-mounting region 73 exhibits a relatively large amount of variation in deformation, such as warpage, in the rolling direction of the stiffener and a relatively small amount of variation in deformation in a direction perpendicular to the rolling direction. Specifically, in the comparative embodiment, because the first direction of the IC-chip-mounting region 73 substantially matches the rolling direction of the stiffener, the dimension of the IC-chip-mounting region 73 along the rolling direction is the longest dimension. As a result, the amount of variation in deformation of the wiring substrate is large in the IC-chip-mounting region 73.

In contrast, in the present, third embodiment, because the second direction of the IC-chip-mounting region 73 substantially matches the rolling direction of the stiffener, the dimension of the IC-chip-mounting region 73 along the rolling direction is the shortest dimension. Accordingly, the amount of variation in deformation of the wiring substrate 70 is most dramatically suppressed in the IC-chip-mounting region 73. This is conceivably a reason why, in the heat cycle test, no fracture occurred in the connections between the IC chip and the wiring substrate 70.

It will be appreciated from the foregoing that the wiring substrate 70 of the present embodiment provides high reliability connections to an IC chip mounted thereon.

The wiring substrate 70 of the present, third embodiment may also be manufactured in a manner similar to that of the first embodiment.

In the wiring substrate 70 of the present, third embodiment, the second direction of the IC-chip-mounting region 73 substantially matches the rolling direction of the stiffener 31. However, the present is not limited to this implementation. The connection reliability can also be improved as mentioned above when the first direction of the IC-chip-mounting region 73 intersects the rolling direction at an angle. However, the second direction of the IC-chip-mounting region 73 preferably matches the rolling direction as in the case of the present, third embodiment described above, since the connection reliability is improved most dramatically with such an arrangement.

Fourth Embodiment

A fourth embodiment of the present invention will next be described. The present, fourth embodiment is different from the above-described first, second and third embodiments in that the profile or outline of a stiffener is smaller than that of a wiring substrate body. The description of features similar to those of the above-described embodiments may be omitted or presented in an abbreviated form.

Figure 7A:
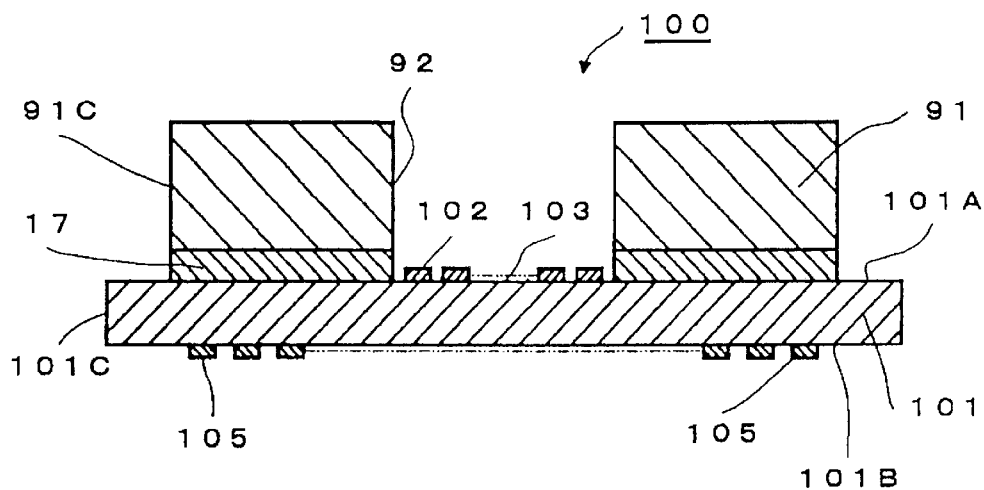
FIG. 7A is an enlarged sectional view of a wiring substrate according to a fourth embodiment of the present invention.
Figure 7B:
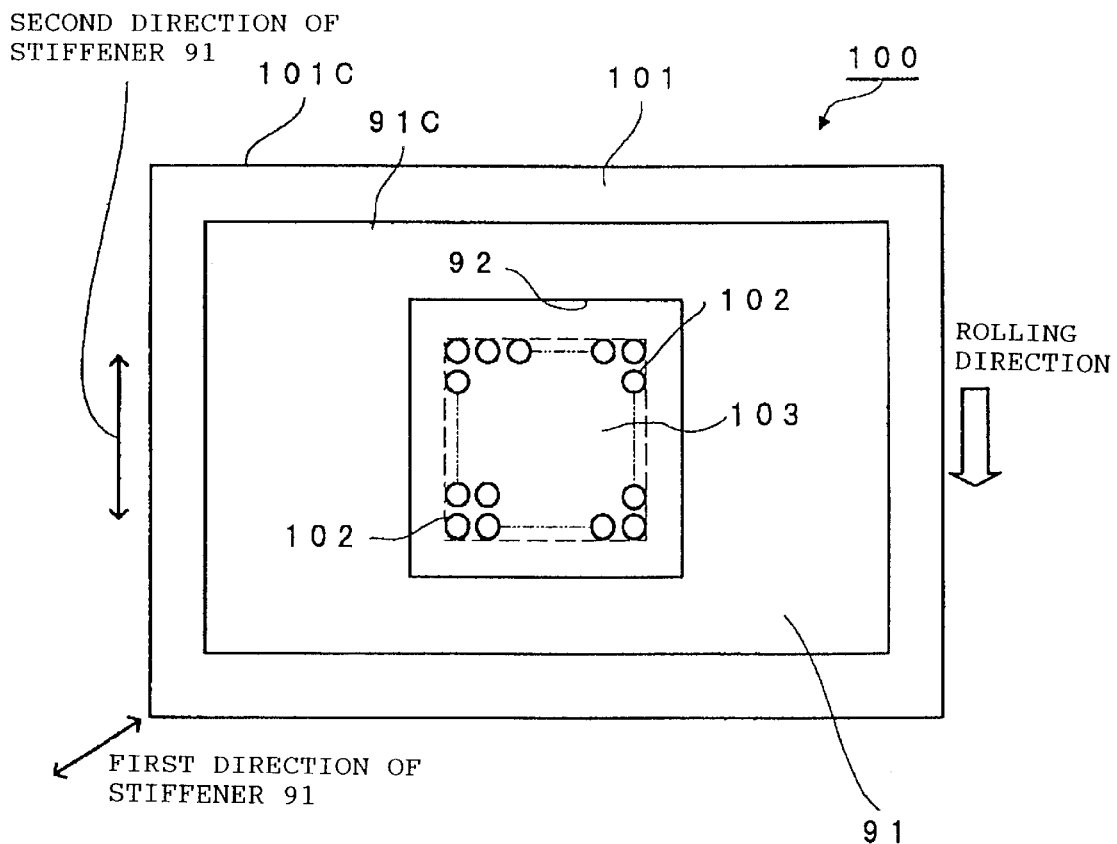
FIG. 7B is a plan view of the wiring substrate of FIG. 7A as viewed from above a first main surface of the wiring substrate body.

As indicated above, FIG. 7A is an enlarged sectional view of a wiring substrate 100 while FIG. 7B is a plan view of the wiring substrate 100 as viewed from above a first main surface 101A of a wiring substrate body 101.

As illustrated, the wiring substrate 100 has the shape or form of a substantially rectangular plate and includes a substantially rectangular stiffener 91, of exemplary dimensions of 30 mm×40 mm, and a substantially rectangular wiring substrate body 101 of exemplary dimension of 38 mm×50 mm.

The stiffener 91 is bonded to the wiring substrate body 101 in such a manner as to be positioned substantially at the center of the first main surface 101A. The stiffener 91 has a shape or form similar to that of the stiffener 1 of the first embodiment, but is formed from a rolled stainless sheet.

The wiring substrate body 101 has the shape or form of a substantially rectangular plate and has a first main surface 101A and a second main surface 101B. The profile or outline 101C of the wiring substrate body 101 is larger than the profile or outline 91C of the stiffener 91. A plurality of connection pads 102 are arranged on the first main surface 101A and define a substantially square IC-chip-mounting region 103 (represented by dashed lines in FIG. 7B). A plurality of electrode pads 105 are arranged on the second main surface 101B.

The relationship between the profiles or outlines 91C and 101C and the rolling direction of the stiffener 91 will be described.

Because the stiffener 91 is smaller than the wiring substrate body 101, any deformation of the wiring substrate 100, such as produced during manufacture of the wiring substrate 100 or caused by temperature variations experienced by the wiring substrate 100, will arise with respect to a portion of the wiring substrate 100 where the stiffener 91 is bonded to the wiring substrate body 101. Accordingly, by providing an appropriate relationship between the profile or outline 91C of the stiffener 91 and the rolling direction of the stiffener 91, deformation, such as warpage, of the wiring substrate 100 can be reduced or eliminated.

Specifically, in the wiring substrate 100 of the present, fourth embodiment, as shown in FIG. 7B, the rolling direction of the stiffener 91 (the vertical direction represented by a first arrow in FIG. 7B) intersects the first direction of the profile or outline 91C of the stiffener 91 (a diagonal direction represented by a further arrow in FIG. 7B) at an angle. Further, the rolling direction substantially matches the second direction of the profile of outline 91C (the direction of the short sides or the vertical direction represented by a further arrow in FIG. 7B).

Accordingly, as was the case with the previously-described embodiments, the wiring substrate 100 according to the present, fourth embodiment is unlikely to suffer warpage or waviness during the course of manufacture thereof. Further, the amount of variation in deformation of the wiring substrate 100 after being subjected to repeated cycles of heating and cooling is also small. Therefore, the wiring substrate 100 as constructed as described above, can improve the reliability of connections made to an electronic component mounted thereon as well as the reliability of connections made to another printed wiring board.

The wiring substrate 100 of the present, fourth embodiment may also be manufactured in a manner similar to that of the first embodiment.

Fifth Embodiment

A fifth embodiment of the present invention will next be described. The present, fifth embodiment is different from the above-described embodiments in that the profile or outline of the stiffener employed is larger than that of a wiring substrate body. As before, the description of features similar to those of the above-described embodiments will be omitted in some cases or presented in an abbreviated form.

Figure 8A:
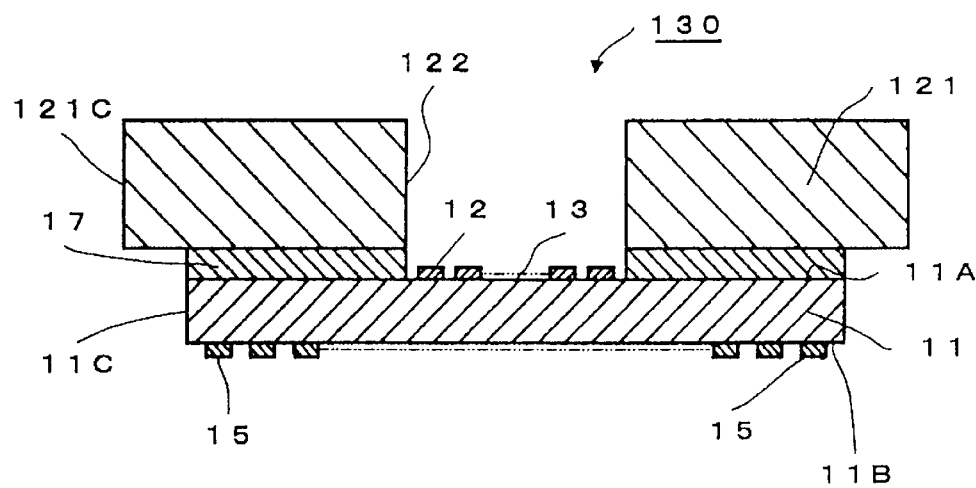
FIG. 8A is an enlarged sectional view of a wiring substrate according to a fifth embodiment of the present invention.
Figure 8B:
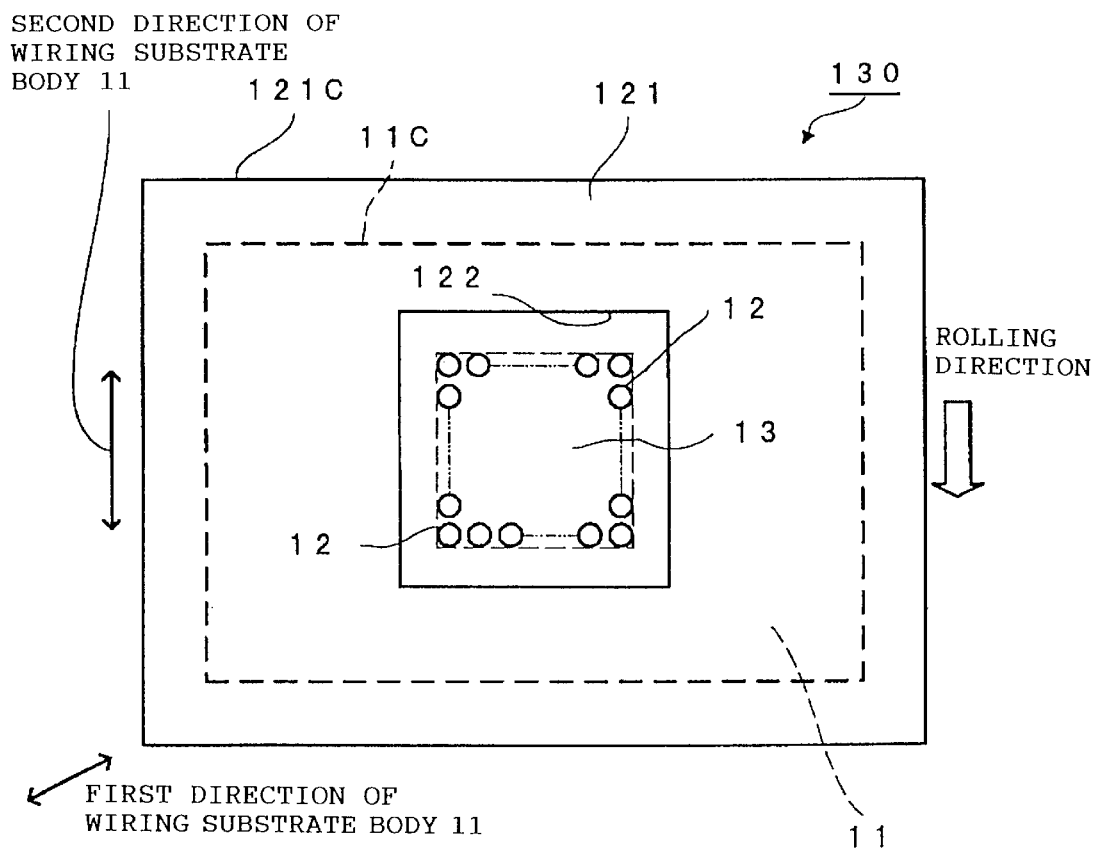
FIG. 8B is a plan view of the wiring substrate of FIG. 8A as viewed from above a first main surface of the wiring substrate body.
Figure 9A:
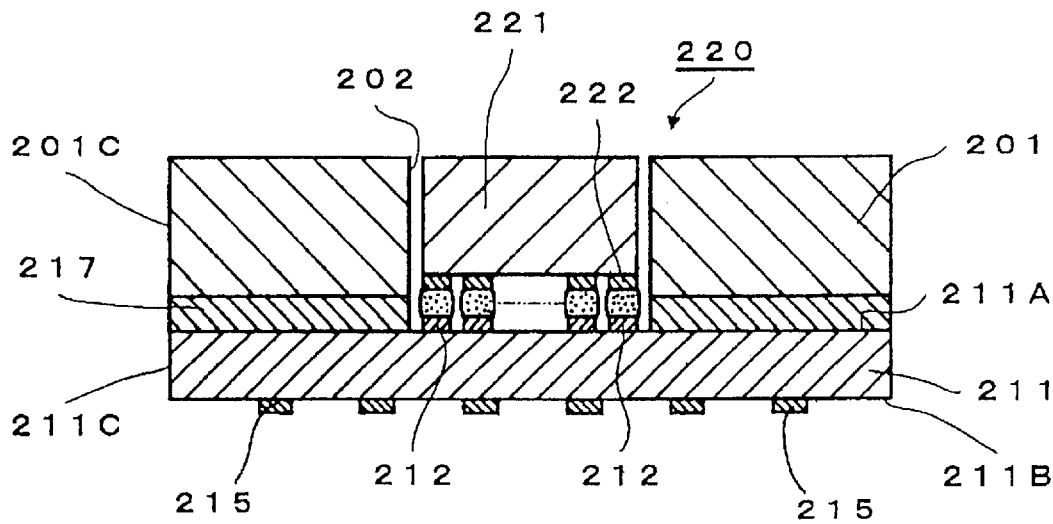
FIG. 9A, which was described above, is an enlarged sectional view of a conventional wiring substrate.
Figure 9B:
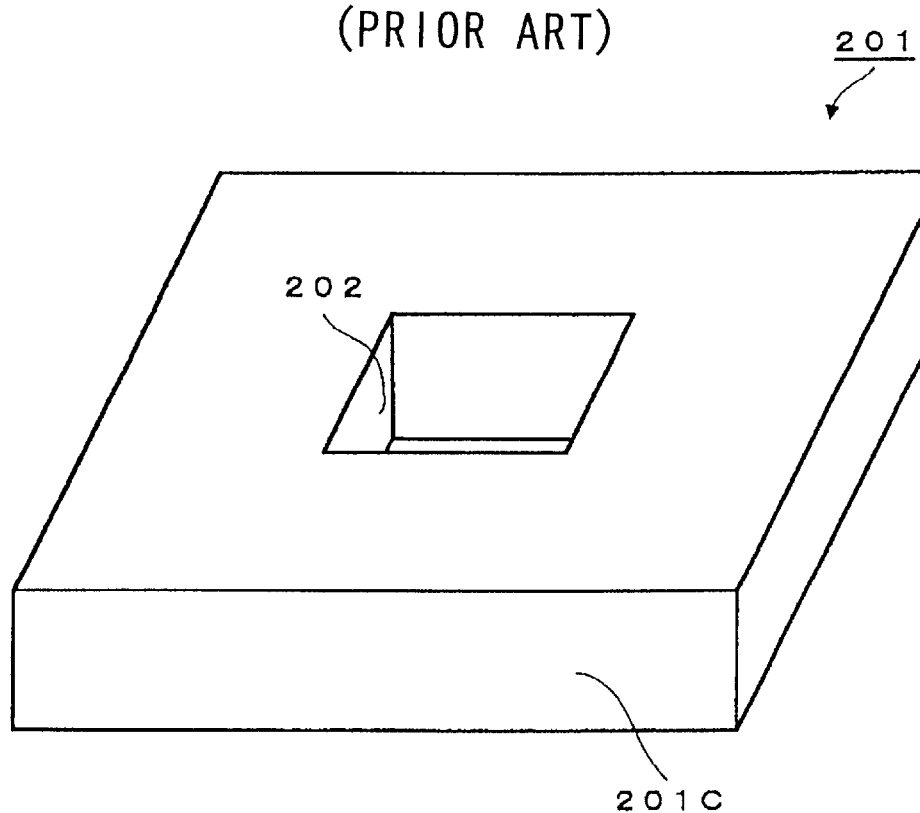
FIG. 9B, which was also described above, is a schematic perspective view of a stiffener for use in the conventional wiring substrate of FIG. 9A.

As indicated above, FIG. 8A is an enlarged sectional view of a wiring substrate 130 while FIG. 8B is a top plan view of the wiring substrate 130 as viewed from above a first main surface 11A of a wiring substrate body 11.

The wiring substrate 130 has the shape or form of a substantially rectangular plate and includes a substantially rectangular stiffener 121 (of dimensions equal to, e.g., 38 mm×50 mm) and a substantially rectangular wiring substrate body 11 (of dimensions equal to, e.g., 30 mm×40 mm). The wiring substrate body 11 is bonded to the stiffener 121 in such a manner as to be positioned substantially at the center of the stiffer 121.

The stiffener 121 is formed from a rolled aluminum sheet and has a through-hole 122 formed therein substantially at its center, as in the case of the first embodiment.

The relationship between the profiles or outlines 121C and 11C and the rolling direction of the stiffener 121 will now be described.

Because the stiffener 121 is larger than the wiring substrate body 11, any deformation of the wiring substrate 130, such as that associated with manufacture of the wiring substrate 130 or that associated with temperature variations experienced by the wiring substrate 130, will arise with respect to a portion of the wiring substrate 130 at which the wiring substrate body 11 is bonded to the stiffener 121. Accordingly, by providing an appropriate relationship between the profile or outline 11C of the wiring substrate body 11 and the rolling direction of the stiffener 121, deformation, such as warpage, of the wiring substrate 130 can be eliminated or suppressed.

Specifically, in the wiring substrate 130 of the present embodiment, as shown in FIG. 8B, the rolling direction of the stiffener 121 (the vertical direction represented by a first arrow in FIG. 8B) intersects the first direction of the outline 11C of the wiring substrate body 11 (the diagonal direction represented by a further arrow in FIG. 8B) at an angle. Further, the rolling direction substantially matches the second direction of the profile or outline 11C of the wiring substrate body 11 (the direction of the short sides of body 11 or the vertical direction, represented by a further arrow in FIG. 8B).

As a consequence of the foregoing, the wiring substrate 130 according to the present, fifth embodiment also unlikely to suffer warpage or waviness during the course of manufacture thereof. Also, the amount of variation in the deformation of the wiring substrate 130 after being subjected to repeated cycles of heating and cooling is small. Therefore, the wiring substrate 130, when constructed as described above, can improve the reliability of connections made to an electronic component mounted thereon as well as the reliability of connections made to another printed wiring board.

The wiring substrate 130 of the present embodiment can also be manufactured in a manner similar to that of the first embodiment.

While the present invention has been described with reference to the preferred embodiments, the present invention is not limited thereto. In this regard, the present invention can be modified, as appropriate, without departing from the spirit of the present invention.

For example, the above embodiments have been described in relation to IC chip 21 as representative of an electronic component to be mounted on the wiring substrates 10, 20, etc. However, a different electronic component, such as a chip resistor or a capacitor, can be mounted thereon. Moreover, according to the embodiments described above, the IC chip 21 is connected to the wiring substrate body 11 through flip-chip bonding. However, die bonding may also be employed for the connection. Further, a plurality of electronic components may be similarly mounted.

The above embodiments have been described relative to substantially rectangular (including substantially square) stiffeners, wiring substrate bodies, and wiring substrates. However, the present invention is not limited to these shapes and for example, the profiles or outlines here may be chamfered or radiused at their corners and a polygonal shape or from may also be employed.

What is claimed is:

1. A wiring substrate comprising:

a wiring substrate body having a main surface; and a metallic plate formed from a rolled metallic sheet so as to define a rolling direction of the metallic plate, and having a boundary profile, in a plan view, which is identical to, or smaller than, that of the wiring substrate body, the metallic plate being bonded to the wiring substrate body within the main surface of the wiring substrate, the rolling direction of the metallic plate intersecting, at an angle, a first direction of the boundary profile of the metallic plate that extends perpendicular to two parallel lines which are separated by a perpendicular distance therebetween and which contact and enclose therebetween the boundary profile of the metallic plate in such a manner as to maximize the perpendicular distance between the two lines.

2. A wiring substrate according to claim 1, wherein the metallic plate serves as a stiffener for reinforcing the wiring substrate body.

3. A wiring substrate according to claim 1, wherein the metallic plate is cut from a rolled metallic sheet such that the first direction of the boundary profile of the metallic plate intersects the rolling direction of the metallic plate at an angle.

4. A wiring substrate according to claim 1, wherein the rolling direction of the metallic plate matches a second direction of the boundary profile of the metallic plate, the second direction being perpendicular to two further parallel lines which are spaced apart by a perpendicular distance therebetween which contact and enclose therebetween the boundary profile of the metallic plate in such a manner as to minimize the perpendicular distance between the two lines.

5. A wiring substrate comprising:

a wiring substrate body having a main surface; and a metallic plate formed from a rolled metallic sheet so as to define a rolling direction of the metallic plate, the metallic plate having a boundary profile, in a plan view, which is identical to, or larger than, that of the wiring substrate body, the main surface of the wiring substrate body being bonded to the metallic plate within the boundary profile of the metallic plate, the rolling direction of the metallic plate intersecting, at an angle, a first direction of the boundary profile of the wiring substrate body, the first direction being perpendicular to two parallel lines which are spaced apart by a perpendicular distance therebetween and which contact and enclose therebetween the boundary profile of the wiring substrate body in such a manner as to maximize the perpendicular distance between the two lines.

6. A wiring substrate according to claim 5, wherein the metallic plate serves as a stiffener for reinforcing the wiring substrate body.

7. A wiring substrate according to claim 5, wherein the rolling direction of the metallic plate matches a second direction of the boundary profile of the wiring substrate body, the second direction being perpendicular to two further parallel lines which are separated by a perpendicular distance therebetween and which contact and enclose therebetween the boundary profile of the wiring substrate body in such a manner as to minimize the perpendicular distance between the two further lines.

8. A wiring substrate comprising:

a wiring substrate body having a main including an IC-chip-mounting region having a boundary profile, in a plan view, and a metallic-plate-bonding region arranged to surround the IC-chip-mounting region; and a metallic plate formed from a rolled metallic sheet so as to define a rolling direction of the metallic plate and having a hole formed therein corresponding to the IC-chip-mounting region, the metallic plate being bonded to the metallic-plate-bonding region, the rolling direction of the metallic plate intersecting, at an angle, a first direction of the boundary profile of the IC-chip-mounting region, the first direction being perpendicular to two parallel lines which are separated by a perpendicular distance therebetween and which contact and enclose therebetween the boundary profile of the IC-chip-mounting region in such a manner as to maximize the perpendicular distance between the two lines.

9. A wiring substrate according to claim 8, wherein the metallic plate serves as a stiffener for reinforcing the wiring substrate body.

10. A wiring substrate according to claim 8, wherein the rolling direction of the metallic plate matches a second direction of the boundary profile of the IC-chip-mounting region, the second direction being perpendicular to two further parallel lines which are separated by a perpendicular distance therebetween and which contact and enclose therebetween the boundary profile of the IC-chip-mounting region in such a manner as to minimize the distance between the two lines.

* * * * *